(12) United States Patent
Yen et al.

(10) Patent No.: US 7,079,430 B2
(45) Date of Patent: Jul. 18, 2006

(54) MEMORY DEVICE WITH BUILT-IN ERROR-CORRECTION CAPABILITIES

(75) Inventors: Miin Nan Yen, Hsinchu (TW); Duo Sheng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 300 days.

(21) Appl. No.: 10/449,590

(22) Filed: Jun. 2, 2003

(65) Prior Publication Data

US 2004/0240282 A1 Dec. 2, 2004

(51) Int. Cl.
*G11C 7/00* (2006.01)

(52) U.S. Cl. .................................... 365/200; 365/230.03
(58) Field of Classification Search ................. 365/200, 365/230.03
See application file for complete search history.

(56) References Cited

U.S. PATENT DOCUMENTS

| 5,161,157 | A | 11/1992 | Owen et al. |
| 6,091,258 | A | 7/2000 | McClintock et al. |
| 6,252,808 | B1 | 6/2001 | Yoo |
| 6,643,197 | B1 * | 11/2003 | Chen et al. ................. 365/200 |

* cited by examiner

*Primary Examiner*—Michael Tran
(74) *Attorney, Agent, or Firm*—Akin Gump Strauss Hauer & Feld, LLP

(57) ABSTRACT

A semiconductor memory device having built-in error-correction capabilities, which comprises a primary array containing a plurality of memory cells; a redundancy array containing at least one replacement cell for replacing at least one defective cell in the primary array, wherein the defective cell is identified by a control signal and the control signal varies according to a defective state of the defective cell over time; and a switching circuit comprising a reprogrammable logic array that is coupled to the primary array and the redundancy array for receiving the control signal to switch a cell signal of the defective cell to the replacement cell.

29 Claims, 3 Drawing Sheets

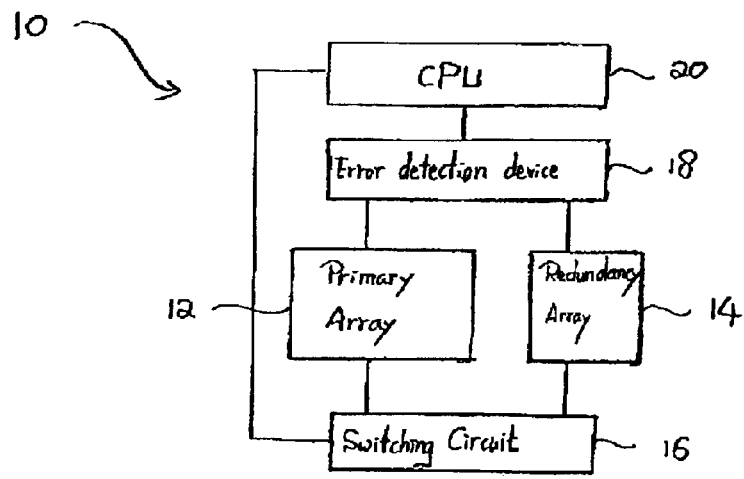
Figure 1
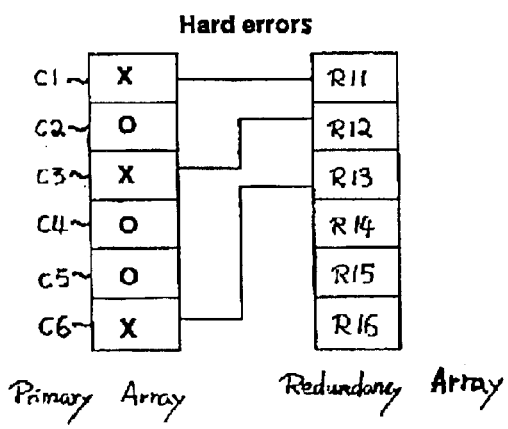
Figure 2A
Figure 2B

MEMORY DEVICE WITH BUILT-IN ERROR-CORRECTION CAPABILITIES

FIELD OF THE INVENTION

This invention pertains in general to a semiconductor memory device and, more particularly, to a memory device with built-in error-correction capabilities and a method of operating a memory device to provide built-in error-correction capabilities.

BACKGROUND

In the design of a semiconductor memory device, redundant memory cells are generally manufactured together with the memory array along columns or rows of the memory array. A redundancy circuit is provided to control the replacement of one or more defective memory cells in the memory array with one or more of the redundant memory cells. The redundant memory cells allow the memory device to function properly even when there are defective memory cells in the memory array.

Generally, the redundancy circuit is connected to the redundant memory cells, and selects a column or row of redundant memory cells to replace a corresponding column or row of memory cells that has one or more defective cells. In particular, the redundancy circuit responds to an address signal that corresponds to a defective cell in the memory array by accessing a redundant memory cell instead of the defective cell.

A conventional redundancy circuit design uses fusible links for on a logic circuit to generate signals that effectuate the replacement of defective cells. The logic circuit may be consisted of an array of logic gates that have fusible links between the logic gates. The fusible link design allows the electrical connections between logic gates to be "programmed" by providing a large current to the one or more links to sever the fusible links. The logic circuit, programmed with specific remaining connections between logic gates, operates the redundancy circuit to permanently replace defective cells with redundant cells.

However, if the replacement redundant memory cell becomes defective at a later time, the permanency of the redundant circuit prevents the replacement redundant cell to be replaced, thereby limiting the reliability and flexibility of the memory device. As a result, the conventional redundancy circuit can only be used to replace defective memory cells resulted from the manufacturing process, and not memory cells that later became defective after the memory device is put to operation.

SUMMARY OF THE INVENTION

In accordance with the invention, there is provided a memory device that includes a primary array, a redundancy array, and a switching circuit. The primary array contains a plurality of memory cells, including a first defective cell and a second defective cell. The redundancy array contains at least one replacement memory cell for replacing at least one defective cell in the primary array. The switching circuit, coupled to the primary array and the redundancy array, receives a first control signal to switch a cell signal of the first defective cell to the replacement cell and receives a second control signal to switch the cell signal of the second defective cell to the replacement cell. In one embodiment, the first and second defective cells are respectively identified by the first and second control signals, which vary according to a defective state of the first and second defective cells over time.

Also in accordance with the invention, there is provided a memory device having built-in error-correction capabilities. The memory device includes a primary array, a redundancy array, and a switching circuit. The primary array contains a plurality of memory cells. The redundancy array contains at least one replacement cell for replacing at least one defective cell in the primary array. The defective cell is identified by a control signal and the control signal varies according to a defective state of the defective cell over time. The switching circuit comprises a reprogrammable logic array that is coupled to the primary array and the redundancy array for receiving the control signal to switch a cell signal of the defective cell to the replacement cell.

In accordance with the invention, there is additionally provided a method for operating a memory device to provide built-in error-correction capabilities. The method includes providing a primary array containing a plurality of memory cells, providing a redundancy array containing a plurality of redundancy cells for replacing at least one defective cell in the primary array, providing a control signal to identify the defective cell, varying the control signal according to a defective state of the defective cell over time, and providing a switching circuit for receiving the control signal and switching a cell signal of the defective cell to the replacement It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and, together with the description, serve to explain the principles of the invention.

BRIEF DESCRIPTION OF THE DRAWINGS

FIG. 1 shows a block diagram of a memory device consistent with one embodiment of the present invention;

FIG. 2A shows a block diagram illustrating the replacement of memory cells consistent with one embodiment of the present invention;

FIG. 2B shows a replacement chart illustrating the replacement of memory cells consistent with one embodiment of the present invention;

DESCRIPTION OF THE EMBODIMENTS

Figure 3:
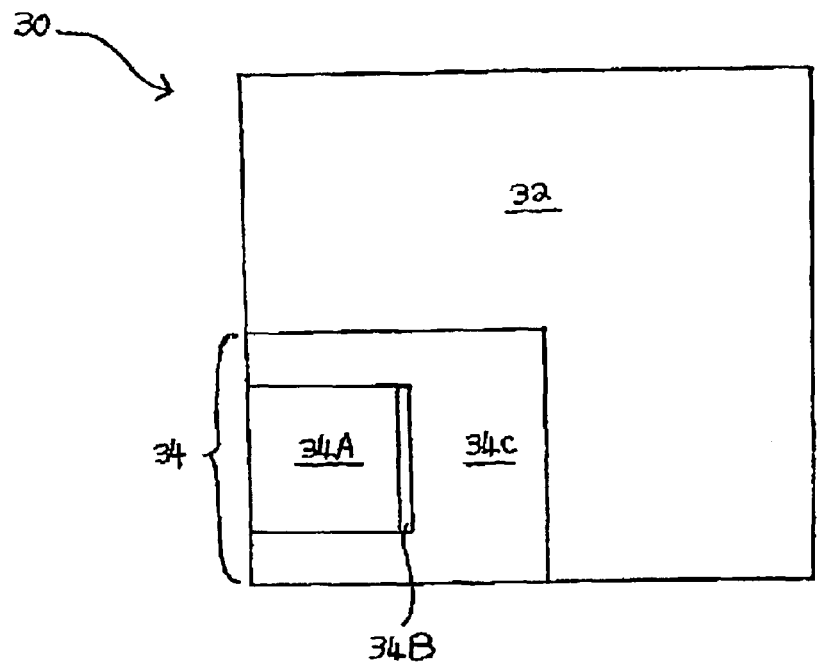
FIG. 3 illustrates an example of a semiconductor chip layout consistent with one embodiment of the present invention.

Reference will now be made in detail to the present embodiment of the invention, an example of which is illustrated in the accompanying drawings. Wherever possible, the same reference numbers will be used throughout the drawings to refer to the same or like parts.

The present invention provides a memory device and a method of operating a memory device. Particularly, the present invention provides a memory device and method for operating a memory device that allows replacement of one or more defective memory cells. The following paragraphs will first describe the components of the memory device and an example of using the memory device as an embedded memory device consistent with one embodiment of the present invention. The following paragraphs will then describe the use of a memory device in a system with multiple processors and a method, both consistent with the embodiments of the present invention.

FIG. 1 shows a block diagram of a memory device consistent with one embodiment of the present invention. Referring to FIG. 1, a memory device 10 includes a primary array, or a memory array, 12, a redundancy array 14, and a switching circuit 16. In one embodiment, memory device 10 may further include an error detection device 18 and a central processing unit ("CPU") 20. Primary array 12 includes a plurality of memory cells (not shown), such as flash memory cells or any other type of memory cells that store data. The memory cells receive data from one or more devices, such as a signal processor, a computer, or an application-specific processing device and store the data that may be read, overridden, or erased later. Redundancy array 14 also includes a plurality of memory cells. The memory cells in primary array 12 and redundancy array 14 are generally identical. For purposes of the present invention, assume some of the memory cells in primary array 12 are defective due to manufacturing defects and/or other factors that temporarily or permanently affect the operations of one or more memory cells in primary array 12. When one or more defective cells are identified, the redundancy cells in the redundancy array 14 may be used to replace the defective cells. The number of redundancy cells provided in redundancy array 14 is generally smaller than the number of cells in primary array 12. The size of redundancy array 14 may depend on various factors, such as the size of primary array 12, the likely number of defective cells, and cost considerations.

To replace defective cells with redundancy cells, switching circuit 16, coupled to both primary array 12 and redundancy array 14, receives data to be stored in the defective cells, transmits the data to be stored to the redundancy cells, and processes other signals or data. In particular, switching circuit 16 receives a control signal to switch the cell signal of a defective cell in primary array 12 to a replacement cell in redundancy array 14. The cell signal may include information necessary for accessing a memory cell, such as an address signal, and other information such as input and output data. In one embodiment, the control signal received by switching circuit 16 may vary according to the defective state of the defective cell over time. In other words, the control signal may vary when a functional cell becomes defective or when a defective cell becomes functional. The varying control signal allows switching circuit 16 to choose to discontinue a memory cell to be replaced or establish a new cell replacement. In one embodiment, switching circuit 16 may be a logic array, such as a reprogrammable logic array ("RPLA"). In particular, the RPLA may be coupled to multiple processors to allow the access of memory device 10 by multiple processors, such as by receiving a cell signal from and transmitting a cell signal to those processors.

Furthermore, rather than replacing a single defective memory cell, switching circuit 16 may replace a defective cell by replacing the specific block, group, or set of memory cells to which the defective cell belongs. Accordingly, a block, group, or set of replacement cells in a redundancy array may be used to replace a specific block, group, or set of memory cells in the primary array that has one or more defective cells. The choice of replacing defective cells individually or replacing defective cells as a group depends on a number of factors, such as the design and type of memory device, the application of the memory device, the type of system that accesses the memory device, and even the type of the defect, or error, with the replaced memory cells.

Generally, there are two types of errors with a memory cell: permanent and temporary. A permanent error, also known as a hard error, means that the error is irreversible. A common permanent error occurs during the manufacturing process of the memory device. A temporary error, also known as a soft error, means that a memory cell is only temporarily defective and the defect may vary over time. In other words, memory cells with temporary errors may be defective only for a period of time and need to be replaced only for that particular defective period.

To replace a temporarily defective cell, a control signal for controlling switching circuit 16 may vary according to the defective state of the temporarily defective cell over time. The varying control signal allows the memory device to use the redundancy array more efficiently and, as a result, leave more redundancy cells available for replacing additional defective cells.

FIGS. 2A and 2B provide a block diagram and a replacement chart, respectively, to illustrate two types of errors in memory cells and the replacement of memory cells consistent with one embodiment of the present invention. Referring to replacement of memory cells with hard errors in FIG. 2A, memory cells C1 through C6 are memory cells in a memory array and redundancy cells R11 through R16 are replacement cells in a redundancy array. Memory cells C2, C4, and C5 function within specifications, and memory cells C1, C3, and C6 are permanently defective. A control signal instructs a switching circuit to replace defective cells C1, C3, and C6, respectively, with replacement cells R11, R12, and R133, for example, by switching cell signals of cells C1, C3, and C6 with those of replacement cells R11, R12, and R13, respectively.

Referring to the replacement chart for soft errors in FIG. 2B, memory cells A1 through A5 are memory cells in a primary array and replacement memory cells R1 through R3 are memory cells in a redundancy array. Between the time periods T1 through T4, memory cell A1 functions properly and memory cell A5 is defective. Memory cell A2 is defective during time period T1, and memory cell A3 is defective during periods T1 through T3. Memory cell A4 is defective during periods T2 through T4. Therefore, the control signal varies over these periods according to the defective states of these (temporarily) defective cells.

In operation, during time period T1, the control signal instructs the switching circuit to replace cell A2 with redundancy cell R1, to replace cell A3 with redundancy cell R2, and to replace cell A5 with redundancy cell R3. During time periods T2 and T3, because cell A2 is no longer defective, the control signal is varied to reverse the earlier replacement instructions for cell A2. Furthermore, because redundancy cell R1 is now available, the control signal instructs the replacement of cell A3 with redundancy cell R1, the replacement of cell A4 with redundancy cell R2, and the replacement of cell A5 with redundancy cell R3. During time period T4, because cell A3 is no longer defective, the control signal is varied to reverse the earlier instruction to replace cell A3. Furthermore, because redundancy cell R1 is now available, the control signal instructs the replacement of cell A4 with redundancy cell R1 and the replacement of cell A5 with redundancy cell R2. As a result, redundancy cell R3 now becomes available for replacing other cells. Therefore, in one embodiment, a switching circuit may use a replacement cell in a redundancy array to replace different defective cells in a primary array over time according to the defective states of the defective cells over time.

As illustrated above, the control signal may vary according to the defective state(s) of one or more defective cells over time. To detect the defective states of the memory cells, memory device 10 in FIG. 1 includes error detection device 18 coupled to primary array 12 and redundancy array 14 for detecting the functionality of memory cells in primary array 12, redundancy array 14, or both, either periodically and/or upon specific commands. In one embodiment, error detection device 16 is a cell tester, such as an external tester or a built-in self-tester ("BIST"). A BIST, when used, may become a part of memory device 10 or a part of a system chip containing memory device 10.

In addition, memory device 10 may include CPU 20 for providing a control signal to switching circuit 16 in a system consistent with one embodiment of the present invention. Referring to FIG. 1, CPU 20 may be coupled to switching circuit 16. To obtain the defective states of memory cells, CPU 20 also may be coupled to error detection device 18 to receive data identifying defective cells, such as data identifying defective cells by their addresses. When the data from error detection device 18 varies as a result of changes in the defective states of memory cells in primary array 12, CPU 20 varies the control signal. The updated control signal then instructs switching circuit 16 to properly replace newly defective cells and/or undo the replacement of now functional cells. In one embodiment, the control signal may identify the cells by addresses or any other cell identification information.

Memory device 10 may also be an embedded memory device that belongs to a system manufactured on a single semiconductor chip, also known as system on chip ("SOC"). FIG. 3 illustrates an example relating to the layout of an SOC chip 30 consistent with one embodiment of the present invention. SOC chip 30 includes a system circuit area 32, such as a digital logic circuit and a memory module 34. Memory module 34 may be a flash memory module in one embodiment and may include a primary array 34A, a redundancy array 34B, and a control circuit 34C for effectuating the operation of the memory. In one embodiment, control circuit 34C may include one or more devices, such as a switching circuit, a BIST, a processor for generating a control signal, or other conventional device capable of receiving and providing the requisite signals.

Many modern semiconductor devices adopt an SOC design. However, because memory cells are more susceptible to errors, hard or soft, the SOC chip may easily become defective simply because of a defect in the memory module. As a result, memory module errors may significantly decrease the yield and increase the cost of producing SOC chips because of the high failure rate associated with memory modules. As described above, embodiments consistent with the present invention may correct memory errors with the components noted above, thereby providing a memory device or a memory module having built-in error-correction ("BEC") capabilities. In one embodiment, the addition of the redundancy array and accompanying circuits, which only minimally increases the SOC chip area, may improve the yield rate of producing SOC chips because of the BEC capabilities.

In particular, a redundancy array may only increase an SOC chip area by approximately 1.25% in one embodiment. Consistent with one embodiment of the present invention, memory module 34 in FIG. 3 occupies about one-fourth the entire area of SOC chip 30. Inside memory module 34, primary array 34A occupies about one-half the area of memory module 34, or about one-eighth the area of SOC chip 30. If a redundancy array having about one-tenth the size of primary array 34A, such as redundancy array 34B, is added, the increase in the SOC chip area is approximately 1.25% (10%×⅛), plus additionally minimal area occupied by a control circuit accompanying redundancy array 34B.

Figure 4:
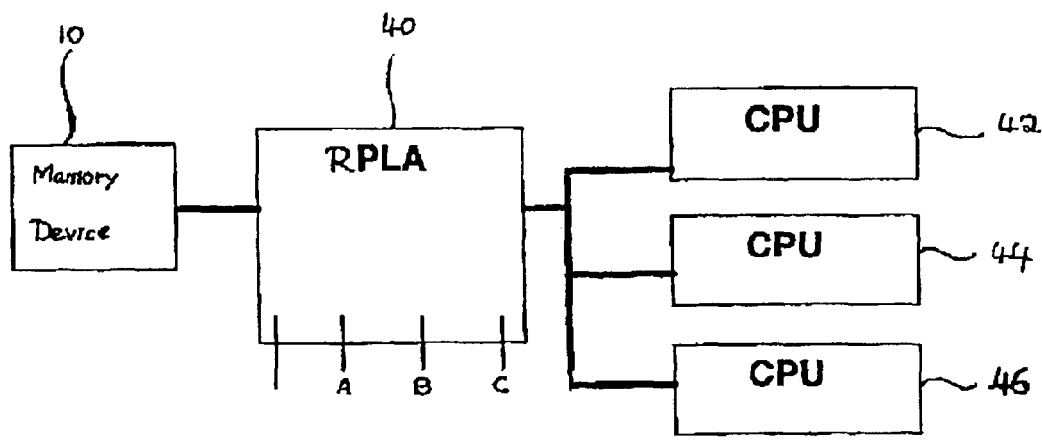
FIG. 4 shows a block diagram of a switching circuit consistent with one embodiment of the present invention.

FIG. 4 shows a block diagram of a switching circuit, such as a RPLA 40, coupled to three CPUs 42, 44, and 46. RPLA 40 is also coupled to memory device 10 to allow data reading and writing by CPUs 42, 44, and 46. As illustrated, RPLA 40 includes one clock terminal CK for receiving a clock signal and three control terminals A, B, and C for controlling the access of memory device 10 by CPUs 42, 44, and 46. The clock signal of RPLA 40 may be the same as or synchronized with the dock signals operating CPUs 42, 44, and 46. In addition, RPLA 40 may have an accompanying processor, such as one similar to CPU 20 in FIG. 1, to generate a control signal for replacing defective memory cells. To manage memory access with multiple processors, RPLA 40 may include a sample and hold circuit consistent with one embodiment of the present invention. The sample and hold circuit may work with different types of system frameworks, such as a synchronous system or a pipeline processing system.

Figure 5:
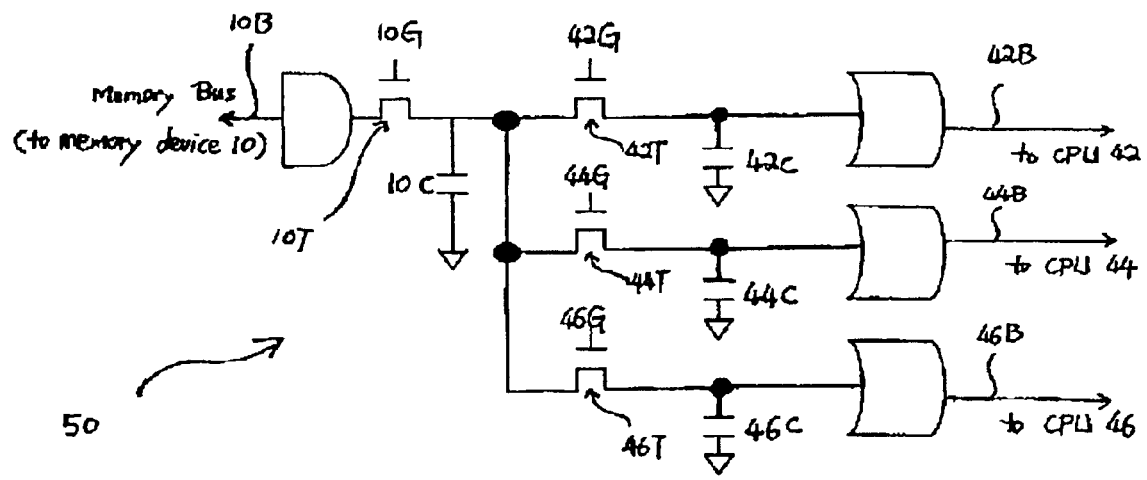
FIG. 5 illustrates a sample and hold circuit consistent with one embodiment of the present invention.

FIG. 5 illustrates an example of a sample and hold circuit 50 providing a transistor and capacitor set for a memory bus 10B and CPU buses 42B, 44B, and 46B. In particular, a transistor 10T and a capacitor 10C are coupled to memory bus 10B. A transistor 42T and a capacitor 42C are coupled to CPU bus 42B. A transistor 44T and a capacitor 44C are coupled to CPU bus 44B. A transistor 46T and a capacitor 46C are coupled to CPU bus 46B. Generally, each of capacitors 10C, 42C, 44C, and 46C serves as a data storage cell and each of accompanying transistors 10T, 42T, 44T, and 46T controls the storing and/or reading of the datum stored.

In operation, memory device 10 transmits data via memory bus 10B when gate terminal 10G of transistor 10T is at a logic high and gate terminals 42G, 44G, and 46G of transistors 42T, 44T, and 46T are at a logic low. Capacitor 10C therefore stores the data. Thereafter, one of CPU buses 42B, 44B, and 46B is selected to read the stored data when one of gate terminals 42G, 44G, and 46G becomes a logic high and gate terminal 52G is at a logic low. For example, if the voltage on gate terminal 42G becomes high, the stored data pass to capacitor 42C and may be accessed by CPU 42 via CPU bus 42B. Similarly, sample and hold circuit 50 may operate with a reversed sequence of gate terminal selections, such as by providing a logic high at gate terminal 42G and then at gate terminal 10G, to pass data from CPU 42 via CPU bus 42B to be stored in memory device 10 via memory bus 10B.

Figure 6:
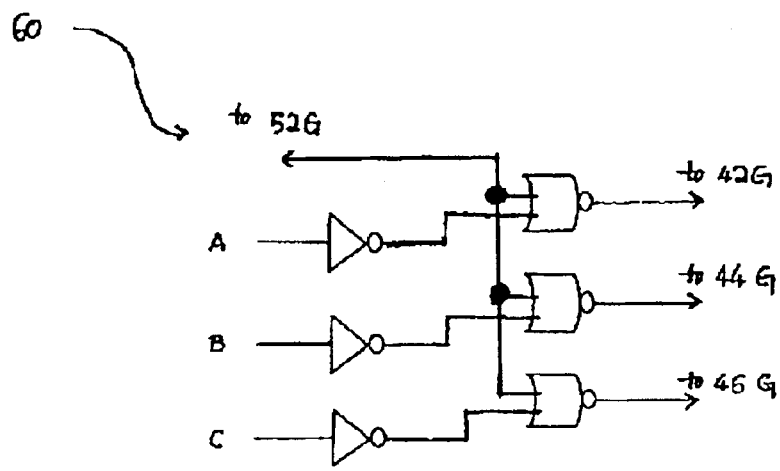
FIG. 6 illustrates a signal generator for controlling memory access consistent with one embodiment of the present invention.

The signals sent to gate terminals 42G, 44G, or 46G for controlling memory access by CPUs 42, 44, and 46 may be generated by a signal generator. FIG. 6 illustrates a signal generator 60 consistent with one embodiment of the present invention. A gate terminal 52G and three controlling terminals A, B, and C may provide the input to signal generator 60. Signal generator 60 generates outputs to gate terminals 42G, 44G, and 46G based on the inputs to control the access of a memory device.

The present invention also provides a method for operating a memory device to provide built-in error-correction capabilities. A method consistent with one embodiment of the present invention includes providing a primary array containing a plurality of memory cells; providing a redundancy array containing a plurality of redundancy cells for replacing at least one defective cell in the primary array; providing a control signal to identify the defective cell; varying the control signal according to a defective state of the defective cell over time; and providing a switching circuit for receiving the control signal and switching a cell signal of the defective cell to the replacement cell.

Furthermore, a processing circuit may be used to provide the control signal in one embodiment. An error detection device may also be provided and coupled to the primary array to detect the defective states of the memory cells in the primary array, redundancy cells in the redundancy array, or both. In particular, a BIST may be used as the error detection device in one embodiment. In another embodiment, the switching circuit may include a reprogrammable logic array coupled to more than one processor and manages data reading from the memory device, data writing to the memory device, or both. Among many applications of the memory device and the method consistent with one embodiment of the present invention, the memory device may be an embedded memory device that accompanies a system manufactured on a single semiconductor chip in one embodiment.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor memory device comprising:
    a primary array containing a plurality of memory cells including a first defective cell and a second defective cell;
    a redundancy array containing at least one replacement memory cell for replacing at least one defective cell in the primary array; and
    a switching circuit coupled to the primary array and the redundancy array for receiving a first control signal to switch a cell signal of the first defective cell to the replacement cell, and receiving a second control signal to switch the cell signal of the second defective cell to the replacement cell, wherein the first and second defective cells are respectively identified by the first and second control signals and the first and second signals vary according to a defective state of the first and second defective cells over time.

2. The semiconductor memory device according to claim, 1, further comprising a processing circuit coupled to the switching circuit to provide the first and second control signals.

3. The semiconductor memory device according to claim 1, further comprising an error-detection device coupled to the primary array to detect the defective state.

4. The semiconductor memory device according to claim 1, wherein the replacement cell is available for replacing the second defective cell when the first defective cell replaced by the replacement cell is no longer defective.

5. The semiconductor device according to claim 1, wherein the switching circuit comprises a reprogrammable logic array.

6. The semiconductor memory device according to claim 1, wherein the switching circuit is coupled to a plurality of processors.

7. The semiconductor device according to claim 1, wherein the defective state is a hard error.

8. The semiconductor device according to claim 1, wherein the defective state is a soft error.

9. The semiconductor memory device according to claim 1, wherein the semiconductor memory device is an embedded memory device.

10. A semiconductor memory device having built-in error-correction capabilities, comprising:
    a primary array containing a plurality of memory cells;
    a redundancy array containing at least one replacement cell for replacing at least one defective cell in the primary array, wherein the defective cell is identified by a control signal and the control signal varies according to a defective state of the defective cell over time; and
    a switching circuit comprising a reprogrammable logic array that is coupled to the primary array and the redundancy array for receiving the control signal to switch a cell signal of the defective cell to the replacement cell.

11. The semiconductor memory device according to claim 10, further comprising a processing circuit that provides the control signal.

12. The semiconductor memory device according to claim 10, further comprising an error detection device coupled to the primary array to detect the defective state of the memory cell in the primary array.

13. The semiconductor memory device according to claim 10, wherein the replacement cell replaces different defective cells in the primary array over time according to the defective states of the defective cells over time.

14. The semiconductor memory device according to claim 10, wherein the switching circuit is coupled to more than one processor and manages one of data reading from the semiconductor memory device and data writing to the semiconductor memory device.

15. The semiconductor memory device according to claim 10, wherein the defective state is a hard error.

16. The semiconductor memory device according to claim 10, wherein the defective state is a soft error.

17. A method for operating a memory device to provide built-in error-correction capabilities, comprising:
    providing a primary array containing a plurality of memory cells;
    providing a redundancy array containing a plurality of redundancy cells for replacing at least one defective cell in the primary array;
    providing a control signal to identify the defective cell;
    varying the control signal according to a defective state of the defective cell over time; and
    providing a switching circuit for receiving the control signal and switching a cell signal of the defective cell to the replacement cell.

18. The method according to claim 17, further comprising providing a processing circuit to provide the control signal.

19. The method according to claim 17, further comprising providing an error detection device coupled to the primary array to detect the defective state of the memory cells in the primary array.

20. The method according to claim 17, wherein providing the switching circuit comprises providing a reprogrammable logic array.

21. A semiconductor memory device comprising:
    a primary array containing a plurality of primary memory cells;
    a redundancy array containing at least one replacement cell; and a switching circuit coupled to the primary array and the redundancy array for receiving control signals to switch a cell signal of at least one primary memory cell to the replacement cell when at least one primary memory cell becomes defective, wherein the defective cell is identified by the control signals and the control signals vary according to a defective state of the defective cell over time.

22. The semiconductor memory device according to claim 21, further comprising a processing circuit coupled to the switching circuit to provide the control signals.

23. The semiconductor memory device according to claim 21, further comprising an error-detection device coupled to the primary array to detect the defective state.

24. The semiconductor memory device according to claim 21, wherein the replacement cell becomes available when the defective primary cell replaced by the replacement cell is no longer defective.

25. The semiconductor device according to claim 21, wherein the switching circuit comprises a reprogrammable logic array.

26. The semiconductor memory device according to claim 21, wherein the switching circuit is coupled to a plurality of processors.

27. The semiconductor device according to claim 21, wherein the defective state is a hard error.

28. The semiconductor device according to claim 21, wherein the defective state is a soft error.

29. The semiconductor memory device according to claim 21, wherein the semiconductor memory device is an embedded memory device.

* * * * *